United States Patent
Chapman et al.

(10) Patent No.: US 10,847,947 B2
(45) Date of Patent: Nov. 24, 2020

(54) GAN LASER DIODE DRIVE FET WITH GATE CURRENT REUSE

(71) Applicant: Efficient Power Conversion Corporation, El Segundo, CA (US)

(72) Inventors: Michael Chapman, Long Beach, CA (US); Ravi Ananth, Laguna Niguel, CA (US); Edward Lee, Fullerton, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/856,309

(22) Filed: Apr. 23, 2020

(65) Prior Publication Data

US 2020/0343688 A1    Oct. 29, 2020

Related U.S. Application Data

(60) Provisional application No. 62/839,982, filed on Apr. 29, 2019.

(51) Int. Cl.
*H01S 5/042* (2006.01)
(52) U.S. Cl.
CPC ................ *H01S 5/042* (2013.01)
(58) Field of Classification Search
CPC ................ H01S 5/042; H01S 5/0261
See application file for complete search history.

(56) References Cited

U.S. PATENT DOCUMENTS

| | | | |
|---|---|---|---|
| 4,096,443 A | 6/1978 | Gilson | |
| 6,720,805 B1 | 4/2004 | Haas | |
| 7,256,615 B2 | 8/2007 | Nair et al. | |
| 7,567,097 B2 | 7/2009 | Wilson et al. | |
| 2015/0097620 A1 | 9/2015 | Adamski | |
| 2019/0305502 A1* | 10/2019 | Frolov | H01S 3/0085 |

* cited by examiner

*Primary Examiner* — Armando Rodriguez
(74) *Attorney, Agent, or Firm* — Blank Rome LLP

(57) ABSTRACT

A laser-diode driver for Lidar applications with an output stage comprised of two enhancement mode GaN FETs. The output stage includes a driver GaN FET in a traditional common-source configuration, with the drain connected to the cathode of a laser diode and the source connected to ground. The gate of the driver GaN FET is driven by the source of the second, substantially smaller GaN FET in a source-follower configuration, rather than being driven directly by a pre-driver. The source-follower GaN FET has its drain connected to the drain of the common-source driver GaN FET, similar to a Darlington connection used in bipolar devices. The input drive signal from the pre-driver is applied at the gate of the source-follower GaN FET. The current required to turn on the driver GaN FET is thereby drawn from a main power supply through the laser diode, rather than from the power supply for the pre-driver, improving overall current efficiency.

11 Claims, 4 Drawing Sheets

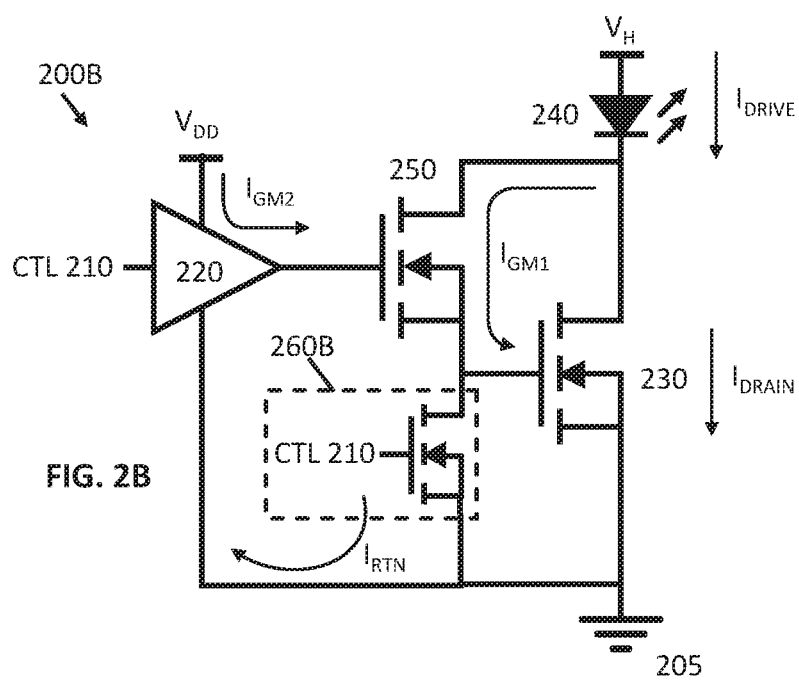

GAN LASER DIODE DRIVE FET WITH GATE CURRENT REUSE

This application claims the benefit of U.S. Provisional Application No. 62/839,982, filed on Apr. 29, 2019, the entire contents of which are hereby incorporated by reference herein.

BACKGROUND

1. Field of the Invention

The present invention relates generally to an output stage including a pre-driver for driving a gallium nitride (GaN) field effect transistor (FET) and, more particularly, to an output stage for use as a laser diode driver for Lidar applications.

2. Description of the Related Art

A typical output stage for driving a laser diode is implemented using a common-source drive FET with the drain of the drive FET connected to the cathode of the laser diode and the source of the drive FET connected to ground. The gate of the drive FET is driven by a pre-driver with enough impulse current capability to overcome the large capacitance of the gate and turn on the drive FET. The pre-driver, powered by a first supply voltage, receives a control signal to turn on the drive FET and generates a gate current from the first supply voltage for driving the gate terminal of the drive FET. The drive FET turns on, and a drive current through the drive GaN FET is drawn from a second supply voltage that is greater than the first supply voltage.

FIG. 1 illustrates a schematic of a conventional output stage including a pre-driver and a GaN power FET for driving a laser diode. The circuit 100 includes a pre-driver 120, a drive GaN FET 130, and a laser diode 140. Diode 140 is the load in this example, but other implementations may include other loads. Pre-driver 120 receives a control signal CTL 110 that indicates drive GaN FET 130 is to be turned on and generates a gate current $I_{GM1}$ from the supply voltage $V_{DD}$. Pre-driver 120 applies $I_{GM1}$ to the gate terminal of the GaN FET 130, which turns on and draws the drive current $I_{DRIVE}$ through diode 140 from the supply voltage $V_H$ that is higher voltage than $V_{DD}$.

The gate current $I_{GM1}$ drawn from VD decreases the efficiency of circuit 100 and results in a large return current $I_{RTN}$. Parasitic impedance on the electrical connections between the pre-driver 120 and the ground node 105 and between the drive GaN FET 130 and the ground node 105 in combination with $I_{RTN}$ can cause voltage drops, ground bounce, and ringing on ground node 105. Ground bounce occurs in response to the ground traces exhibiting ripples in voltage from high current pulses such as $I_{RTN}$. If the ground bounce becomes large enough, it may cause error voltages in pre-driver 120, such that pre-driver 120 does not generate the proper gate current $I_{GM1}$ in response to CTL 110 indicating that drive FET 130 is to be turned on.

SUMMARY OF THE INVENTION

The present invention addresses the disadvantages of increased power consumption, ground bounce, and ringing on ground nodes as discussed above by providing a driver circuit that comprises a first GaN FET in a common-source configuration and a second GaN FET in a source-follower configuration.

More specifically, the present invention, as described herein, comprises a driver circuit for a load (such as a laser diode) comprising a first GaN FET connected in a common-source configuration with its drain connected to the load to be driven (from a first power supply voltage) and its source connected to ground. The driver circuit also includes a second, substantially smaller GaN FET connected in a source-follower configuration with its drain connected to the load and its source connected to the gate terminal of the first GaN FET. A pre-driver, powered by a second supply voltage, drives the second GaN FET in accordance with a control signal, such that the gate drive current for the first GaN FET is provided by the first supply voltage and flows through the load and through the second GaN FET, thereby improving overall circuit efficiency.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIGS. 2A and 2B illustrate schematics of the driver circuit of the present invention with gate current reuse according to a first embodiment of the present invention.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 2A:
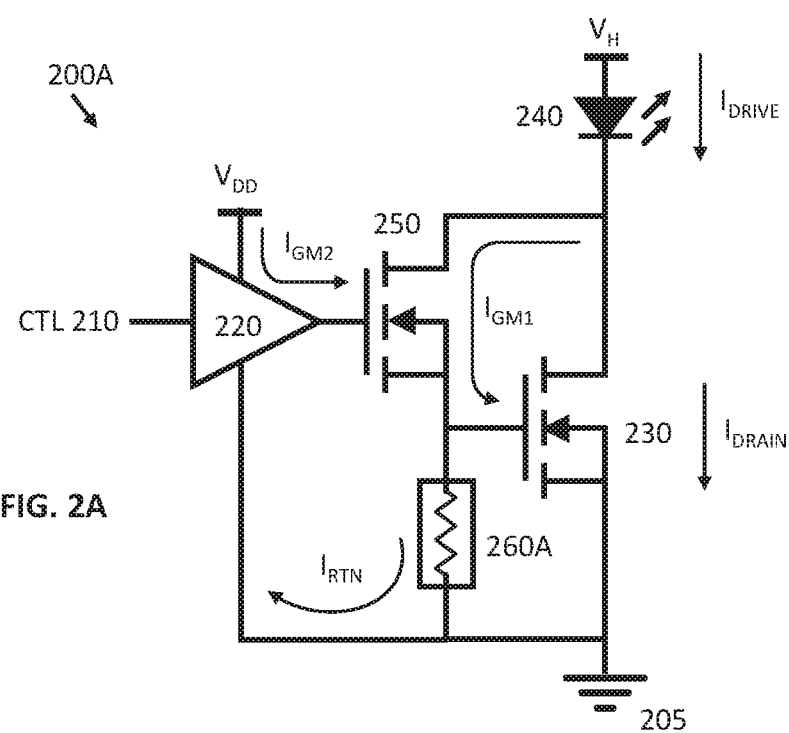

FIGS. 2A and 2B illustrate schematics of the driver circuit with gate current reuse according to an embodiment of the present invention. The circuits 200A and 200B each include a pre-driver circuit 220, a drive FET transistor 230 in a common-source configuration, a laser diode 240, a source-follower FET transistor 250, and a load 260A/260B. Laser diode 240 is the load driven by drive transistor 230 in this example, but other implementations may include other loads. FET transistors 230 and 250 are preferably enhancement mode GaN FETs as shown, and may be integrated into a single semiconductor chip. Drive GaN FET 230 is substantially larger than GaN FET 250, i.e., the gate width of GaN FET 250 is much smaller than the gate width of drive GaN FET 230, such that the gate capacitance of GaN FET 250 is much smaller than the gate capacitance of GaN FET 230.

Pre-driver circuit 220 receives a control signal CTL 210 that indicates drive GaN FET 230 is to be turned on, and is connected to a supply voltage $V_{DD}$ and ground node 205. The output of pre-driver circuit 220 is connected to the gate terminal of GaN FET 250, which is configured as a source-follower. The gate terminal of GaN FET 250 is driven by a gate current Iec generated by pre-driver circuit 220. The drain terminal of GaN FET 250 is connected to the cathode of laser diode 240 and the drain terminal of drive FET 230, and the source terminal of GaN FET 250 is connected to the load 260A/260B and the gate terminal of drive GaN FET 230. The load may be implemented with a resistor 260A as shown in FIG. 2A, or a synchronous pulldown switch 260B as shown in FIG. 2B.

The anode of laser diode 240 is connected to a second supply voltage $V_H$ that is greater than the supply voltage $V_{DD}$. The drain terminal of drive GaN FET 230 is connected to the cathode of diode 240 and the drain terminal of GaN FET 250, and the source terminal of drive FET 230 is connected to ground node 205. The gate terminal of drive FET 230 is driven by gate current $I_{GM1}$, which is the drain-to-source current through GaN FET 250.

In response to CTL 210 indicating drive FET 230 is to be turned on, pre-driver circuit 220 generates the drive current $I_{GM2}$ from the supply voltage $V_{DD}$ and applies it to the gate terminal of GaN FET 250. Because the gate capacitance of GaN FET 250 is much smaller than the gate capacitance of drive FET 230, the drive current $I_{GM2}$ is much smaller than the drive current $I_{GM1}$, which reduces the current consumption of pre-driver 220 and the current draw through $V_{DD}$ and increases the system efficiency. GaN FET 250 turns on and draws a current $I_{DRIVE}$ through diode 240 from the higher supply voltage $V_H$. The drain-to-source current through GaN FET 250 is the gate current $I_{GM1}$ applied to the gate terminal of drive GaN FET 230.

Figure 1:
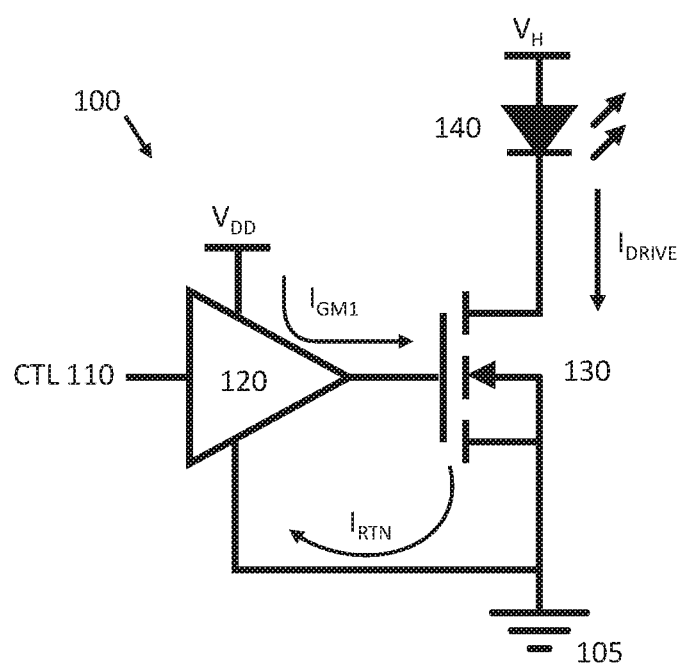
FIG. 1 illustrates a schematic of a conventional circuit for driving a laser diode.

The gate current $I_{GM1}$ is drawn from the higher supply voltage $V_H$, which is better able to supply the large current impulse needed to turn on the drive GaN FET 230 than the lower supply voltage $V_{DD}$. In addition, the gate current $I_{GM1}$ is drawn through laser diode 240, contributing to the diode drive current $I_{DRIVE}$ and the optical output power. Drive GaN FET 230 turns on and draws a drain-to-source current $I_{DRAIN}$, which greatly increases the drive current $I_{DRIVE}$ through diode 240. The gate current $I_{GM2}$ is less than the gate current $I_{GM1}$ applied to the gate terminal of drive GaN FET 130 shown in FIG. 1, which reduces the return current $I_{RTN}$ and the associated detrimental effects such as ringing, ground bounce, and voltage drops on ground node 205. The load 260 further reduces ringing, ground bounce, and voltage drops on ground node 205 from the return current $I_{RTN}$.

Figure 3:
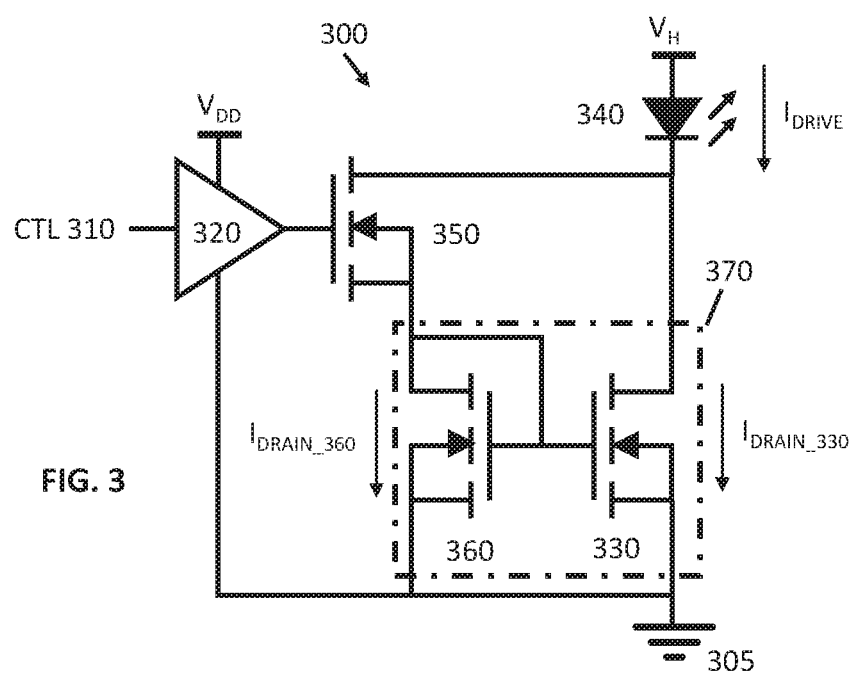
FIG. 3 illustrates a schematic the driver circuit of the present invention with gate current reuse according to a second embodiment of the present invention.

FIG. 3 illustrates a schematic of a driver circuit with gate current reuse according to a second embodiment of the present invention. Circuit 300 is similar to the circuit 200 shown in FIG. 2, but includes a third enhancement mode GaN FET configured as a diode in place of load 260A or 260B, with GaN FET 360 and drive GaN FET 330 arranged as a current mirror 370. GaN FETs 330, 350, and 360 may be integrated onto a single semiconductor chip. The current ratio of current mirror 370 may be represented as:

$$\frac{I_{DRAIN\_330}}{I_{DRAIN\_360}} = \frac{W_{330}}{W_{360}}$$

where $I_{DRAIN\_330}$ represents the drain-to-source current through drive FET 330, $I_{DRAIN\_360}$ represents the drain-to-source current through GaN FET 360, $W_{330}$ represents the gate width of drive FET 330, and $W_{360}$ represents the gate width of GaN FET 360.

With a sufficiently large ratio, only a fraction of the drive current $I_{DRIVE}$ through laser diode 340 is diverted to the gate drive path through the smaller GaN FETs 350 and 360. Use of a third GaN FET 360 to implement a current mirror 370 allows a well-defined current ratio and precise control over current through the gate drive path and through the drive GaN FET 330. Because drive GaN FET 330 is much larger than the smaller GaN FETs 350 and 360 in the gate drive path, drive GaN FET 330 is better able to withstand large currents. Thus, it is preferable to divert a larger portion of the drive current $I_{DRIVE}$ through drive GaN FET 330 and a smaller portion through GaN FETs 350 and 360.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A driver circuit for a load having a first terminal connected to a first supply voltage and a second terminal, comprising:
    a first FET connected in a common-source configuration having a drain connected to the second terminal of the load, a source connected to ground, and a gate for receiving a gate drive current;
    a second FET connected in a source-follower configuration having a drain connected to the second terminal of the load, a source connected to the gate of the first FET, and a gate; and
    a pre-driver powered by a second supply voltage and having an input for receiving a control signal and an output connected to the gate of the second FET, such that the pre-driver drives the second FET in accordance with the control signal, and the gate drive current for the first FET is provided by the first supply voltage and flows through the load and through the second FET.

2. The driver circuit of claim 1, wherein the load comprises a laser diode.

3. The driver circuit of claim 1, wherein the first FET is an enhancement mode GaN FET and the second FET is an enhancement mode GaN FET.

4. The driver circuit of claim 3, wherein the pre-driver, the first GaN FET, and the second GaN FET are integrated onto a single semiconductor chip.

5. The driver circuit of claim 3, wherein the first GaN FET is substantially larger than the second GaN FET.

6. The driver circuit of claim 3, further comprising a second load connected between the source terminal of the second GaN FET and ground.

7. The driver circuit of claim 6, wherein the second load comprises a resistor.

8. The driver circuit of claim 6, wherein the second load comprises a synchronous pulldown switch.

9. The driver circuit of claim 6, wherein the second load comprises a third GaN FET configured as a diode and has a gate connected to the gate of the first GaN FET, forming a current mirror between the third GaN FET and the first GaN FET.

10. The driver circuit of claim 9, wherein the current mirror has a current mirror ratio that causes a drain-to-source current through the third GaN FET to be substantially smaller than the drain-to-source current through the first GaN FET.

11. The driver circuit of claim 9, wherein the pre-driver circuit, the first GaN FET, the second GaN FET, and the third GaN FET are integrated onto a single semiconductor chip.

\* \* \* \* \*